(12) United States Patent
Darveaux et al.

(10) Patent No.: US 6,201,305 B1
(45) Date of Patent: Mar. 13, 2001

(54) MAKING SOLDER BALL MOUNTING PADS ON SUBSTRATES

(75) Inventors: Robert F. Darveaux, Higley; Barry M. Miles; Alexander W. Copia, both of Chandler, all of AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/591,705

(22) Filed: Jun. 9, 2000

(51) Int. Cl.$^7$ .................................................. H01L 23/48
(52) U.S. Cl. ......................... 257/779; 257/780; 257/781
(58) Field of Search ................................. 257/780, 781, 257/779

(56) References Cited

U.S. PATENT DOCUMENTS 5,327,013 * 7/1994 Moore et al. ........................ 257/772
5,977,632 * 11/1999 Beddingfield ....................... 257/737

* cited by examiner

Primary Examiner—Cathy Lam
(74) Attorney, Agent, or Firm—Skjerven Morrill MacPherson; Don C. Lawrence

(57) ABSTRACT

The invention discloses a method of making solder ball mounting pads on a substrate that have better ball shear performance, ball thermal cycle reliability, ball attach yield, and ball positional tolerances, than the solder ball mounting pads of the prior art. The method includes providing a sheet of material having a layer of metal thereon, and patterning the layer to define a solder ball mounting pad therein. The pad includes a central pad having at least two spokes radiating outward from it. An insulative mask is formed over the metal layer, and an opening is formed in the mask such that the central pad and an inner portion of each of the spokes is exposed therethrough, and an outer portion of each of the spokes is covered by the mask. In one embodiment, the central pad, spokes, and opening in the mask are shaped and arranged with respect to each other such that the pad and exposed portion of the spokes form a radially symmetrical pattern within the opening.

18 Claims, 2 Drawing Sheets

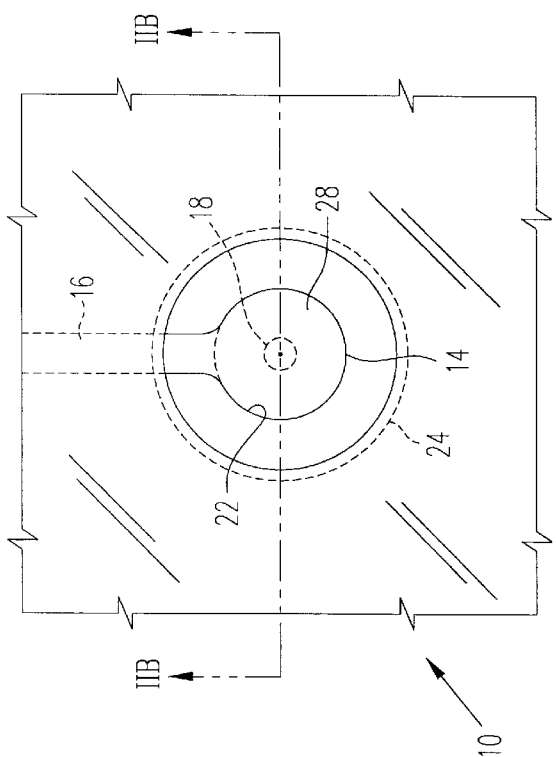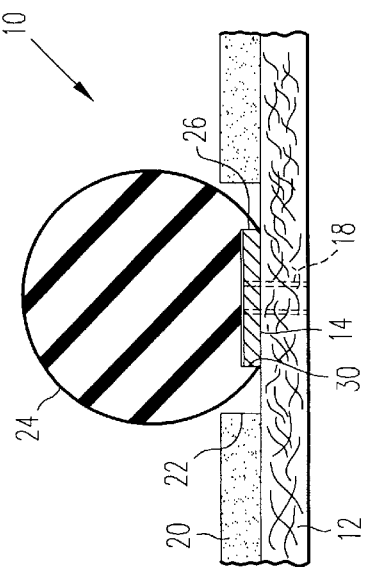
FIG. 1A (Prior Art)
FIG. 1B (Prior Art)
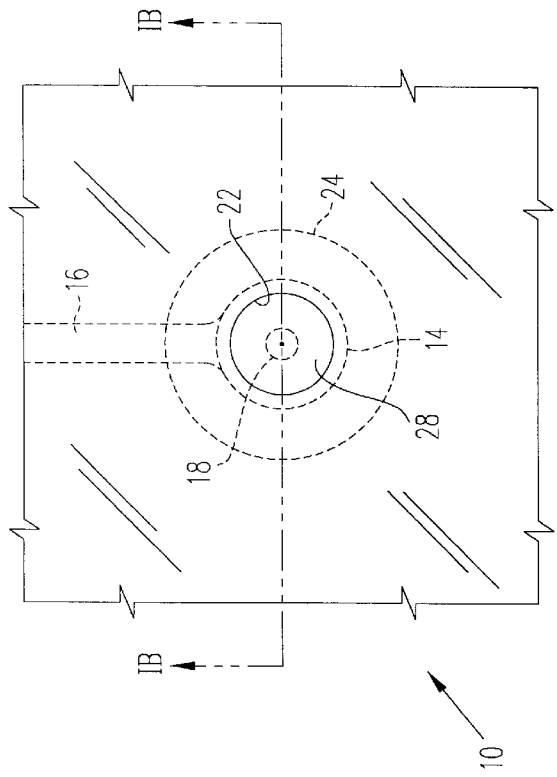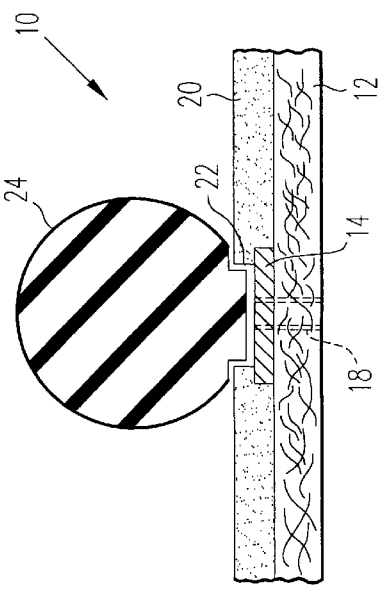
FIG. 2A (Prior Art)
FIG. 2B (Prior Art)

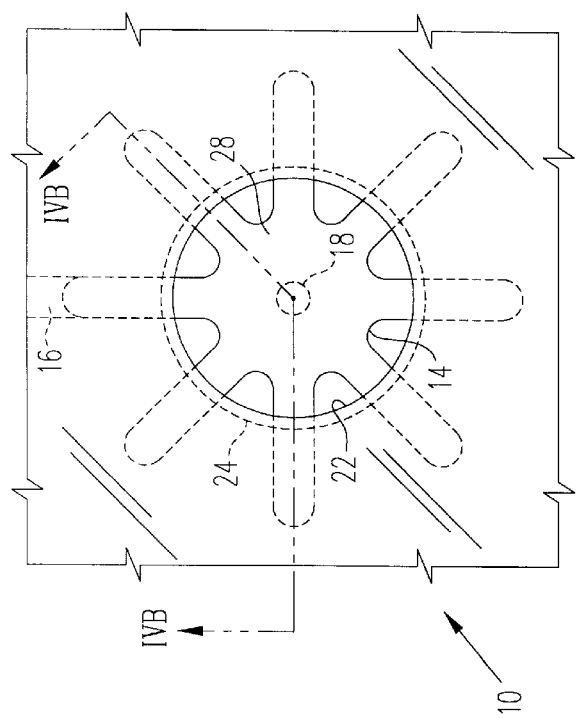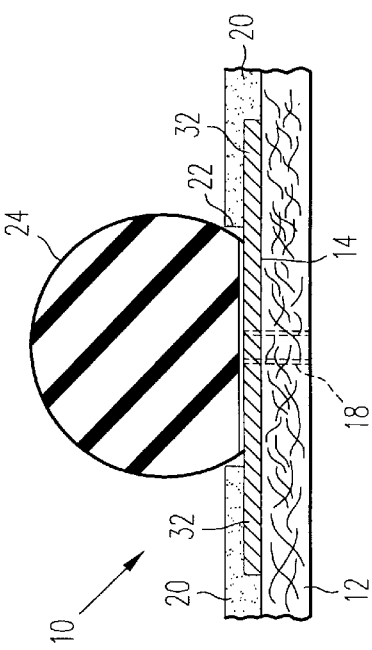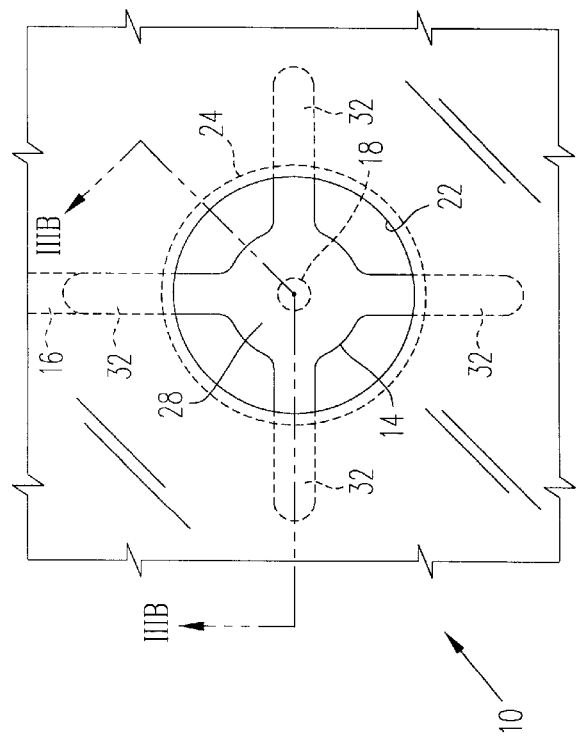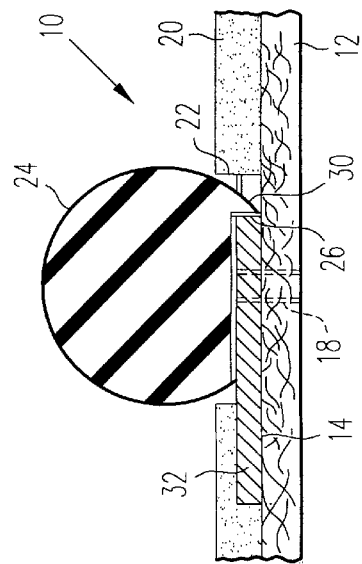

MAKING SOLDER BALL MOUNTING PADS ON SUBSTRATES

BACKGROUND

1. Technical Field

This invention pertains generally to the mounting and connecting of electronic devices, and more particularly, to a method of making an improved solder ball mounting pad on a substrate.

2. Related Art

An increasing demand for electronic equipment that is smaller, lighter, and more compact has resulted in a concomitant demand for semiconductor packages that have smaller outlines and mounting "footprints."

One response to this demand has been the development of the so-called "flip-chip" method of attachment and connection of semiconductor chips to substrates. Sometimes referred to as the "Controlled Collapse Chip Connection," or "C4," method, the technique involves forming balls of a conductive metal, e.g., solder or gold, on input/output connection pads on the active surface of the chip, then inverting, or "flipping" the chip upside-down, and "reflowing" the conductive balls, i.e., heating them to the melting point, to fuse them to corresponding connection pads on a substrate.

Another response has been the development of so-called ball grid array ("BGA") semiconductor packages that "surface mount" and electrically connect to an associated substrate, e.g., a printed circuit board ("PCB"), with a plurality of solder balls in a method, sometimes referred to as the "C5" method, that is analogous to the flip-chip method described above for mounting and connecting dies.

In both the C4 die and C5 package mounting and connection methods, a plurality of solder balls are attached to respective solder ball mounting lands, or pads, defined on a surface of the die or package. The solder ball mounting pad may, but need not be, defined by an opening in an insulative layer or mask called a "passivation layer" in the case of a semiconductor die, or a "solder mask" in the case of a BGA package, as described below.

FIG. 1A is a top plan view of a portion of a substrate 10 having a solder-mask-defined ("SMD") solder ball mounting pad 28 formed thereon in accordance with the prior art. FIG. 1B is a cross-sectional view looking into the substrate 10 and pad 28 along the lines IB—IB in FIG. 1A. The substrate 10 may comprise a sheet 12 of an insulative material, such as fiberglass, polyimide tape, or ceramic, or alternatively, it may comprise a semiconductor chip or die.

The pad 28 typically comprises a layer of metal, e.g., copper, aluminum, gold, silver, nickel, tin, platinum, or a combination of the foregoing that has been laminated and/or plated on a surface of the sheet 12, then patterned using known photolithography techniques into a central pad structure 14, which may include one or more circuit traces 16 (shown by dotted lines) radiating outward from it. Alternatively, or in addition to the traces 16, a plated-through hole, called a "via" 18 (shown by dotted lines), may connect the central pad 14 with the opposite surface of the sheet 12.

An insulative mask 20, referred to as a passivation layer in the case of a semiconductor die, or a solder mask in the case of a BGA package, is formed over the metal layer, including the central pad 14. The insulative layer 20 may comprise an acrylic or a polyimide plastic, or alternatively an epoxy resin, that is silk screened or photo-deposited on the sheet 12. An opening 22 is formed in the insulative mask 20 to expose a central portion 28 of the central pad 14, and a solder ball 24 (shown dotted in FIG. 1A) is attached to the pad 28 thus exposed. Since the mask 20 prevents the solder of the solder ball 24 from attaching to any portion of the central pad 14 other than the portion 28 that is exposed through the opening 22, the pad 28 is referred to a solder-mask-defined or SMD-type of solder ball mounting pad, as above.

A non-solder-mask-defined ("NSMD") solder ball mounting pad 28 in accordance with the prior art is illustrated in the plan view of FIG. 2A, wherein features similar to those in the SMD pad 28 of FIG. 1A are numbered similarly. FIG. 2B is a cross-sectional view looking into the substrate 10 and pad 28 along the section lines IIB—IIB in FIG. 2A.

As may be seen from a comparison of the two sets of figures, the respective pads 28 are very similar, the exception being the size of the opening 22 in the insulative mask 20. In particular, in the NSMD pad 28 of FIGS. 2A and 2B, the opening 22 exposes the entire central pad 14, along with a portion of the surface of the sheet 12 and a portion of the optional circuit trace 16, such that the molten solder of the solder ball 24 can wet and attach to not only the entire upper surface of the central pad 14, but also to the vertical side walls 26 of the pad and the circuit trace.

While each of the SMD and the NSMD prior art solder ball mounting pads 28 has some advantages associated with it, each also has some disadvantages, as well. The SMD pad 28 shown in FIGS. 1A and 1B is the most commonly used solder ball mounting pad today. It provides good "end-of-line" (i.e., at the end of the semiconductor package fabrication line) ball 24 shear resistance because, as may be seen in FIG. 1A, the insulative mask 20 overlaps the entire peripheral edge of the central pad 14, and hence, resists ripping of the pad from the sheet 12 when mechanical forces act on the solder ball 24 attached thereto. However, as may be seen in FIG. 2B, the insulative mask 20 covers no part of the central pad 14 portion of the NSMD pad 28, and consequently, the latter has a relatively lower end-of-line ball 24 shear resistance.

The SMD pad 28 also affords relatively better control of the "x-y" positional tolerances of the solder ball 24, i.e., better control of the lateral position of the solder ball 24 on the surface of the sheet 12, than does an NSMD pad 28 having one or more circuit traces 16 leading from it, such as the one shown in FIG. 2A. This is because the x-y position of the ball 24 on the sheet 12 is affected by two positional parameters: 1) the position on the sheet 12 of the centroid of the opening 22 in the insulative mask 20, and 2) the position on the sheet of the centroid of the area of metal 28 exposed by the opening in the mask, i.e., the area wetted by the molten solder of the ball 24 when the latter is attached to the pad 28. In both instances, the center of gravity ("C.G.") of the solder ball 24 tends to align itself over each of the two respective centroids. As a result, when the centroid of the opening 22 does not coincide with the centroid of the area of exposed metal 28, the C.G. of the solder ball 24 will be positioned approximately half way along a line extending between the two centroids.

As may be seen in FIG. 1A, the shape, or "pattern," of the area of the SMD pad 28 exposed by the circular opening 22 in the insulative mask 20 is, by definition, also circular, and hence, radially symmetrical about the centroid of the exposed area of the pad. Also by definition, the centroid of the pad 28 coincides with the centroid, viz., the center, of the circular opening 22. Hence, so long as the opening 22 in the insulative mask 20 is located within the boundary of the central pad 14, the x-y tolerances on the ball 24 will depend only on the x-y positional tolerances on the centroid of the opening 22, and not on the x-y positional tolerances of the centroid of the pad 14. The presence of the optional via 18 will not change that result, provided the latter is also centered in the opening 22.

However, as may be seen in FIG. 2A, the shape of the NSMD pad 28 exposed by the opening 22 in the mask 20, which includes the entire central pad 14, as well as a portion of the circuit trace 16, is only bilaterally symmetrical about a line passing through the center of the central pad and the circuit trace. Consequently, the centroid of the NSMD pad 28, i.e., of the exposed area of metal, is shifted slightly toward the circuit trace 16, and away from the centroid of the opening 22, which is typically centered on the central pad 14. Hence, the C.G. of the solder ball 24 will be positioned about half way between the respective centroids of the opening 22 and the NSMD pad 28

Thus, the x-y positional tolerances on the ball 24 on an NSMD pad 28 will depend not only on the x-y positional tolerances of the centroid of the opening 22, but also the x-y positional tolerances of the centroid of the NSMD pad 28 as well. The presence of the optional via 18 will not change that result, even if the latter is centered in the opening 22. Moreover, even without a circuit trace 16 or via 18, misalignment of the solder ball 24 can still occur in an NSMD pad 28 if the centroid of the pad 28 is not coincident with the centroid of the opening 22.

While the x-y positional misalignment of the ball 24 relative to the opening 22 resulting from this C.G. "shift" is relatively small, it should be understood that a C4-mounted die or a C-5-mounted semiconductor package can typically have a large number, e.g., up to nine hundred, of such balls on its mounting surface, and that accordingly, these slight misalignments in the array of balls can be additive, such that in some cases, the die or package cannot be successfully mounted to an associated mounting surface.

The prior art NSMD-type pad 28 shown in FIGS. 2A and 2B is used less frequently today than the SMD-type of pad 28 shown in FIGS. 1A and 1B. However, the NSMD pad does have some advantages over the SMD pad. For example, as may be seen from a comparison of FIGS. 1B and 2B, in the NSMD pad 28 in FIG. 2B, the solder of the ball 24 wets down and attaches to the vertical side walls 26 of the central pad 14 and the circuit trace(s) 16, if any, to form a fillet 30 around their respective peripheries. This fillet structure 30 helps to distribute stresses resulting from thermal aging so that the stresses do not concentrate at the interface between the pad 28 and the ball 24. As shown in the SMD pad 14 of FIG. 1B, however, the interface between the pad 14 and the ball 24 lacks this structure, and instead, consists of a simple interface between two planar surfaces.

Another area of superiority of the NSMD pad 28 involves the related problem of "gold embrittlement." It is a common practice in the industry to plate solder ball mounting pads 28 with a layer of nickel, followed by a layer of gold, to improve the solderability of the pads. During the attachment of the balls 24 to the pads 28, some of the tin in the solder combines with the gold to form a brittle "intermetallic" compound of gold and tin, which breaks away from the solder-gold interface and floats up into the molten solder ball 24. Some of the tin in the solder also migrates through the gold to combine with the nickel and form another brittle intermetallic compound of nickel and tin.

The joint strength between the solder ball 24 and the gold-nickel plated pad 28 is good immediately after the attachment of the ball. However, with thermal aging at an elevated temperature, as during a component "burn-in" procedure, some of the tin-gold intermetallic compound diffuses back into contact with the tin-nickel intermetallic compound at the joint, and the two combine to form a hard, brittle interface that is very susceptible to stress-induced cracking.

However, as discussed above, the fillet structure 30 in the NSMD pad 28 of FIG. 2B acts to distribute the stresses associated with thermal aging so that the stresses do not concentrate at the interface between the ball 24 and the pad 28, and hence, at the interface between the two intermetallic compounds. Therefore, the NSMD pad 28 of FIG. 2B exhibits a resistance to the gold embrittlement phenomenon that is superior to the SMD pad 28 of FIG. 1B, because the latter pad lacks this stress de-concentrating structure.

Thus, while the SMD pad 28 has greater end-of-line ball 24 shear resistance and provides better ball x-y positional tolerances than does the NSMD pad 28, the NSMD pad has superior thermal cycle reliability and resistance to gold embrittlement. In view of the foregoing, it would be very desirable if a method could be discovered for making solder ball mounting pads 28 on a substrate 10 that combined the advantages of both types of prior art pads and eliminated some of their disadvantages.

BRIEF SUMMARY

This invention provides a method for making solder ball mounting lands, or pads, on a substrate, e.g., a PCB or a semiconductor die, that have better ball shear performance, ball thermal cycle reliability, ball attach yield, and ball positional tolerances than the solder ball mounting pads of the prior art.

The method includes the provision of a sheet of material, which may be an insulator, such as fiberglass or a polyimide tape, or a layer on a semiconductor chip or die, such as silicon oxide, silicon nitride, glass, or some other insulative material, upon which it is desired to form the improved solder ball mounting pad of the invention. A metal layer is formed on a surface of the sheet, and the layer is patterned to define a solder ball mounting pad of the metal. Importantly, the pad is defined to include a central pad having at least two "spokes" radiating outward from it, one or more of which may comprise conventional circuit traces radiating from the pad.

An insulative mask is then formed over the metal layer. The mask may comprise a conventional passivation layer formed over the active surface of a semiconductor die, or a solder mask formed on, e.g., a PCB or a circuit tape. An opening is formed in the mask that exposes the central pad and a portion of each of the spokes therethrough.

In one advantageous embodiment, the centroid of the opening in the mask is made to coincide with the centroid of the central pad and spoke portions exposed by the opening. In another embodiment, the central pad, the spokes and the opening in the mask are arranged with respect to each other such that the exposed metal of the central pad and the spoke portions form a radially symmetrical pattern within the mask opening.

The solder ball mounting pad thus formed combines the advantages of both SMD and NSMD pad designs. The spokes cooperate with the solder mask to hold the pad down against shear stresses, so that the shear strength of the pads, and hence, solder ball "end-of-line" reliability, is improved, relative to an NSMD pad. The spokes also create fillets, i.e., regions in which the solder of the solder balls can wet around the top edges of the pad to create a complementary fillet of solder. These additional wetting areas and fillets improve the thermal cycle reliability of the ball joint as well as its resistance to gold embrittlement at the ball-pad interface, relative to an SMD pad. Further, since the centroid of the opening corresponds to the centroid of the exposed metal, the solder ball will also be precisely centered in the opening when attached to the pad, thereby improving the positional tolerances of the balls, relative to an NSMD pad.

A better understanding of the above and other features and advantages of the invention may be had from a consideration of the detailed description below of some exemplary embodiments thereof, particularly if such consideration is made in conjunction with the appended drawings.

BRIEF DESCRIPTION OF THE DRAWINGS

FIG. 1A is a top plan view of a substrate having a solder-mask-defined ("SMD") solder ball mounting pad formed thereon in accordance with the prior art;

FIG. 1B is a cross-sectional view into the substrate and SMD mounting pad shown in FIG. 1A, as revealed by a section taken along the lines IB—IB therein;

FIG. 2A is a top plan view of a substrate having a non-solder-mask-defined ("NSMD") solder ball mounting pad formed thereon in accordance with the prior art;

FIG. 2B is a cross-sectional view into the substrate and NSMD mounting pad shown in FIG. 1A, as revealed by a section taken along the lines IB—IB therein;

FIG. 3A is top plan view of a substrate having a solder ball mounting pad formed thereon in accordance with one exemplary embodiment of the present invention;

FIG. 3B is a cross-sectional view into the substrate and novel mounting pad shown in FIG. 3A, as revealed by a section taken along the lines IIIB—IIIB therein;

FIG. 4A is top plan view of a substrate having a solder ball mounting pad formed thereon in accordance with another exemplary embodiment of the present invention; and, FIG. 4B is a cross-sectional view into the substrate and novel mounting pad shown in FIG. 4A, as revealed by a section taken along the lines IVB—IVB therein.

DETAILED DESCRIPTION

The features, advantages, and disadvantages of the prior art SMD and NSMD solder ball mounting pads 28 are discussed in detail above in connection with FIGS. 1A, 1B, 2A, and 2B. A method has been discovered for making a novel solder ball mounting pad on a substrate which achieves some of the advantages, and reduces or eliminates some of the disadvantages, of both types of prior art pads, as described in detail below.

A first exemplary embodiment of a substrate 10 having a solder ball mounting pad 28 in accordance with the present invention is illustrated in the plan view of FIG. 3A, wherein features similar to those in the SMD and NSMD pads 28 shown in FIGS. 1A–2B are numbered similarly. FIG. 3B is a cross-sectional view looking into the substrate 10 and novel pad 28 along the section lines IIIB—IIIB in FIG. 3A. As may be seen in FIGS. 3A and 3B, the substrate 10 comprises a sheet 12 of an insulative material, such as fiberglass, polyimide tape, or ceramic, or alternatively, it may comprise a layer on a semiconductor die, such as silicon oxide, silicon nitride, polyimide, silicon dioxide, or some other insulative material formed on the die.

The pad 28 comprises a layer of metal, e.g., copper, aluminum, gold, silver, nickel, tin, or platinum, or a combination thereof, that has been formed, e.g., by lamination or by plating, on a surface of the sheet 12, and then patterned using photolithography techniques to define a central pad 14 therein. The central pad 14 may include one or more circuit traces 16 (shown by dotted lines) radiating outward from it. Alternatively, or in addition to the circuit traces 16, a via 18 (shown by dotted lines), may electrically connect the central pad 14 with the opposite surface of the sheet.

As above, an insulative mask 20 is formed over the metal layer, and an opening 22 is formed in the insulative mask 20 that, as in the prior art NSMD pad 28 shown in FIGS. 2A and 2B above, exposes the entire central pad 14. Unlike both the SMD and NSMD mounting pads 28 above, however, the mounting pad 28 of this invention also includes at least two "spokes" 32 extending outward from it in a radial direction. The spokes 32 are formed simultaneously with the central pad 14 and the circuit trace(s) 16, if any, and from the same metal layer as the latter.

An inner end portion of each of these spokes 32 is exposed through the opening 22 along with the central pad 14, and an outer end portion of the spokes is covered by the insulative mask 20. One or more of the spokes 32 may comprise a circuit trace 16, and for reasons of symmetry discussed below, the spokes and/or traces should have approximately the same widths. In lieu of any circuit traces 16, the pad 28 may have, in addition to the at least two spokes 32, only a via 18 connecting the central pad 14 to the opposite surface of the substrate 10.

Although the size of the opening 22, the central pad 14, and the spokes 32 can vary widely, depending on the particular application at hand, in one exemplary embodiment, the mask opening may have a diameter of 22 mils (0.55 mm), the central pad may have a diameter of 14 mils (0.35 mm), and the spokes may be 26 mils (0.65 mm) long and 4 mils (0.1 mm) wide, where 1 mil=0.001 inches (or 0.0254 millimeters (mm)). Of course, the length and arrangement of the spokes 32 must be controlled such that adjacent spokes do not short together.

As discussed above, to prevent a positional shift of the C.G. of the ball 24 away from the center of the opening 22, and thus maintain precise control over the x-y positional tolerances of the ball, it is desirable that the centroid of the pad 28, i.e., the area of the central pad 14 and spokes 32 exposed by the circular opening 22 in the insulative mask 20, be coincident with the centroid of the opening. This condition is easily satisfied by making the "pattern" defined by the pad 28 radially symmetrical in the opening 22 in the mask 20. It should be noted that this condition need only be satisfied within the opening 22, and not outside of it. A "test" for this condition is to determine if the pad 28 can be rotated about the centroid of the opening 22 through one or more angular positions of less than 360°, and present an identical pattern at the one or more rotated position(s).

Thus, for example, a "minimal" embodiment (not illustrated) of the novel mounting pad 28 would include a circular central pad 14 and two elongated spokes 32 (or, e.g., one circuit trace 16 and one spoke 32), having equal widths, radiating outward from the pad and spaced apart from each other by 180°. Such a pattern, if rotated through 180° (<360°) about the centroid of the circular opening 22, would reproduce the original pattern at the new rotated position.

Another embodiment of the pad 28 (not illustrated) can include, e.g., a circular central pad 14 having three spokes 32 radiating outward from it and spaced apart from each other by 120°. In the two embodiments respectively illustrated in FIGS. 3A and 4A, the pad 28 of the invention comprises a circular central pad 14 having four spokes spaced apart from each other by 90°, and eight spokes spaced apart from each other by 45°, respectively, each defining a radially symmetrical pattern within the circular opening 22.

As will be understood from an examination of FIGS. 3A, 3B, 4A and 4B and a consideration of the discussion above, the solder ball mounting pad 28 of the present invention achieves some of the advantages, and reduces or eliminates some of the disadvantages, of both types of prior art SMD and NSMD pads 28. In particular, since the spokes 32 are connected to the central pad 14, and since the insulative mask 20 overlaps the end portions of each of the spokes 32, the mask acts to prevent the spokes and central pad from being lifted from the surface of the sheet 12 by mechanical forces acting on a solder ball 24 attached to the pad 28. Thus, the novel pad 28 has a good end-of-line ball shear resistance, one approaching that of the prior art SMD pad 28 in FIGS. 1A and 1B.

Further, the central pad 14 and the spokes 32 have vertical side walls 26 around their interconnected peripheries that create two or more fillets in which the solder of the ball 24 can flow and wet to create complementary fillets 30. These additional wetting areas 26 and fillets 30 act to distribute the stresses associated with thermal aging so that the stresses do not concentrate at the interface between the ball 24 and the pad 28, thereby improving the thermal cycle reliability of the ball-pad solder joint, as well as its resistance to gold embrittlement, in the same manner as the NSMD pad 28 of FIGS. 2A and 2B.

Additionally, if the centroid of the mask opening 22 is made to coincide with the centroid of the pad 28, or alternatively, if the spokes 32 and/or circuit traces 16 are made to have approximately equal widths, and if the central pad 14 and the spokes are arranged with respect to each other and the mask opening 22 such that they form a pattern that is radially symmetrical within the opening, then x-y positional tolerances of the solder ball 24 will depend only on the positional tolerances of the opening, and the ball will be precisely centered in the opening when it is attached to the pad 28, thereby improving the x-y positional tolerances of the ball to those of the SMD pad 28 described above.

Those of skill in the art will appreciate that many variations and modifications can be made to the solder ball mounting pad design of the invention without departing from its spirit and scope. For example, it will be seen that there is a tradeoff in performance with the number and size of the spokes 32. In general, more spoke 32 area will give better end-of-line ball shear performance, but lower thermal cycle reliability, and vice-versa. Thus, all other things being equal, a larger number of narrow spokes 32 will give better overall performance than a smaller number of wider spokes. Moreover, the central pad 14, the spokes 32, and the opening in the mask 20 can each take a wide variety of shapes, provided only that the conditions described above are satisfied.

In light of the foregoing, the scope of the present invention should not be limited to that of the particular embodiments shown and described herein, as they are merely exemplary in nature. Rather, the true scope of this invention should correspond to that of the claims appended hereafter, and their substantial equivalents.

What is claimed is:

1. A substrate of an electronic device for mounting solder balls thereon, the substrate comprising:
   a sheet;
   a metal layer on a surface of the sheet, the layer having a pattern in it defining a central pad therein, the pad having a plurality of spokes radiating outward therefrom; and,
   a insulative mask over the metal layer, the mask having an opening therein, the opening exposing the pad and a portion of each of the spokes therethrough.

2. The substrate of claim 1, wherein at least one of the spokes comprises a circuit trace.

3. The substrate of claim 1, further comprising a via connected to the central pad through the sheet.

4. The substrate of claim 1, wherein each of the opening in the mask and the pattern of metal exposed by the opening has a centroid, and wherein the centroid of the opening coincides with the centroid of the pattern.

5. The substrate of claim 1, wherein the portions of the spokes exposed by the opening have approximately equal widths.

6. The substrate of claim 5, wherein the central pad, the portion of the spokes exposed by the opening in the mask, and the opening in the mask are shaped and arranged with respect to each other such that the central pad and the exposed portion of the spokes form a radially symmetrical pattern within the opening.

7. The substrate of claim 6, wherein the central pad and the opening in the mask are circular in shape.

8. The substrate of claim 1, further comprising a ball of solder mounted on the central pad and the exposed portion of the spokes.

9. The substrate of claim 1, wherein the sheet comprises fiberglass, a polyimide resin, a ceramic, or an insulative layer on a semiconductor chip.

10. The substrate of claim 1, wherein the metal layer comprises copper, aluminum, gold, silver, nickel, tin, platinum, or a combination of the foregoing.

11. The substrate of claim 1, wherein the mask comprises an acrylic plastic, a polyimide, or an epoxy resin.

12. The substrate of claim 1, wherein at least two distinct fillets are formed by the central pad, the spokes, and the opening in the mask.

13. A solder ball mounting for an electronic device, the mounting, comprising:
   a metal layer, including a central pad and at least two spokes radiating outward from the central pad;
   a solder ball in a connection with the central pad and an inner portion of the at least two spokes; and,
   an insulative layer surrounding the connection and covering an outer portion of the spokes.

14. The mounting of claim 13, wherein the connection includes at least two distinct fillets defined by the central pad and the spokes.

15. A method for making a solder ball mounting pad on a substrate, the method comprising:
   providing, a substrate having, a layer of metal thereon, the layer including a pattern defining a central pad with a plurality of spokes radiating outward therefrom; and,
   covering an outer portion of the spokes with an insulating layer.

16. The method of claim 15, wherein covering an outer portion of the spokes with an insulating layer comprises:
   forming an insulative mask over the metal layer; and, forming an opening, in the mask that exposes the central pad and an inner end of each of the spokes therethrough.

17. The method of claim 16, wherein each of the opening in the mask and the pattern in the metal layer exposed by the opening has a respective centroid, and further comprising positioning the respective centroids such that they are coincident with each other.

18. A method for mounting a solder ball on an electronic device, the method comprising:

providing an electronic device having a surface with a metal layer thereon, the metal layer including a pattern defining a central pad having a plurality of spokes radiating outward therefrom;

forming an insulative mask over the metal layer, the mask having an opening in it through which the central pad and an inner portion of each of the spokes is exposed; and, reflowing a ball of solder on the central pad and the exposed portion of the spokes.

* * * * *

UNITED STATES PATENT AND TRADEMARK OFFICE
CERTIFICATE OF CORRECTION

PATENT NO. : 6,201,305 B1  Page 1 of 1
DATED : March 13, 2001
INVENTOR(S) : Robert F. Darveaux, Barry M. Miles and Alexander W. Copia It is certified that error appears in the above-identified patent and that said Letters Patent is hereby corrected as shown below:

<u>Column 8,</u>
Line 47, after "mounting", delete the comma;
Line 60, after "providing", delete the comma; and after "having", delete the comma.

Signed and Sealed this

Twenty-eighth Day of January, 2003

JAMES E. ROGAN
*Director of the United States Patent and Trademark Office*